United States Patent
Sudo

(10) Patent No.: US 8,835,268 B2
(45) Date of Patent: Sep. 16, 2014

(54) METHOD FOR MANUFACTURING SEMICONDUCTOR DEVICE

(75) Inventor: Gaku Sudo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 352 days.

(21) Appl. No.: 13/421,729

(22) Filed: Mar. 15, 2012

(65) Prior Publication Data

US 2013/0065326 A1 Mar. 14, 2013

(30) Foreign Application Priority Data

Sep. 9, 2011 (JP) ................................ 2011-197323

(51) Int. Cl.
| | |
|---|---|
| *H01L 43/12* | (2006.01) |
| *H01L 21/336* | (2006.01) |
| *H01L 27/22* | (2006.01) |
| *H01L 29/66* | (2006.01) |
| *H01L 21/8234* | (2006.01) |

(52) U.S. Cl.
CPC ...... *H01L 21/823431* (2013.01); *H01L 27/228* (2013.01); *H01L 29/66795* (2013.01)
USPC 438/300; 438/3; 257/E21.619; 257/E21.634; 257/E43.006

(58) Field of Classification Search
CPC ..................... H01L 21/823431; H01L 27/228; H01L 29/66795
USPC ............. 438/3, 294, 300, 736, 737, 743, 744; 257/E21.619, E21.634, E43.006
See application file for complete search history.

(56) References Cited

U.S. PATENT DOCUMENTS

| | | | | |
|---|---|---|---|---|
| 6,872,647 | B1 * | 3/2005 | Yu et al. ...................... | 438/585 |
| 7,015,106 | B2 * | 3/2006 | Yoon et al. .................. | 438/283 |
| 7,135,368 | B2 * | 11/2006 | Kito et al. ................... | 438/243 |
| 7,256,078 | B2 * | 8/2007 | Anderson et al. ........... | 438/157 |
| 7,341,916 | B2 * | 3/2008 | Lojek .......................... | 438/284 |
| 7,358,142 | B2 * | 4/2008 | Kang et al. .................. | 438/283 |
| 7,576,010 | B2 * | 8/2009 | Lee et al. .................... | 438/717 |
| 7,880,232 | B2 * | 2/2011 | Fischer et al. .............. | 257/353 |
| 7,994,020 | B2 * | 8/2011 | Lin et al. ..................... | 438/443 |
| 8,003,284 | B2 * | 8/2011 | Yoshikawa et al. ......... | 430/5 |
| 8,012,654 | B2 * | 9/2011 | Yoshikawa et al. ......... | 430/5 |
| 8,039,326 | B2 * | 10/2011 | Knorr et al. ................. | 438/157 |
| 8,071,484 | B2 * | 12/2011 | Kim et al. ................... | 438/717 |

(Continued)

FOREIGN PATENT DOCUMENTS

EP 1 993 136 A1 * 11/2008 ............. H01L 27/12

OTHER PUBLICATIONS

Sudo, U.S. Appl. No. 13/417,524, filed Mar. 12, 2012.
Sudo, U.S. Appl. No. 13/409,319, filed Mar. 1, 2012.

(Continued)

*Primary Examiner* — Mary Wilczewski
(74) *Attorney, Agent, or Firm* — Finnegan, Henderson, Farabow, Garrett & Dunner, L.L.P.

(57) ABSTRACT

A method for manufacturing a semiconductor device includes forming a mask film on a partial region of a semiconductor substrate; forming a mask member above the semiconductor substrate in both the region where the mask film is formed and a region where the mask film is not formed; patterning the mask film and an upper portion of the semiconductor substrate by performing etching using the mask member as a mask. The method further includes removing part of the patterned upper portion of the semiconductor substrate by performing etching using the patterned mask film as a mask.

14 Claims, 16 Drawing Sheets

(56) References Cited

U.S. PATENT DOCUMENTS

| | | | | |
|---|---|---|---|---|
| 8,158,332 | B2* | 4/2012 | Matsunaga et al. | 430/312 |
| 8,273,258 | B2* | 9/2012 | Sone et al. | 216/47 |
| 8,354,320 | B1* | 1/2013 | Xie et al. | 438/279 |
| 8,586,449 | B1* | 11/2013 | Chang et al. | 438/432 |
| 8,603,893 | B1* | 12/2013 | Wei et al. | 438/424 |
| 8,614,138 | B2* | 12/2013 | Sudo | 438/437 |
| 8,617,996 | B1* | 12/2013 | Chi et al. | 438/700 |
| 8,653,630 | B2* | 2/2014 | Liaw et al. | 257/622 |
| 8,658,504 | B2* | 2/2014 | Sudo | 438/294 |
| 8,658,536 | B1* | 2/2014 | Choi et al. | 438/699 |
| 8,691,640 | B1* | 4/2014 | LiCausi et al. | 438/156 |
| 8,697,514 | B2* | 4/2014 | Butt et al. | 438/213 |
| 8,697,515 | B2* | 4/2014 | Yin et al. | 438/239 |
| 2005/0170593 | A1* | 8/2005 | Kang et al. | 438/296 |
| 2007/0102772 | A1* | 5/2007 | Lojek | 257/401 |
| 2008/0102570 | A1* | 5/2008 | Fischer et al. | 438/157 |
| 2010/0203734 | A1* | 8/2010 | Shieh et al. | 438/706 |
| 2010/0308382 | A1* | 12/2010 | Johnson et al. | 257/288 |
| 2010/0308409 | A1* | 12/2010 | Johnson et al. | 257/368 |
| 2011/0045648 | A1* | 2/2011 | Knorr et al. | 438/296 |
| 2012/0295426 | A1* | 11/2012 | Cohen et al. | 438/487 |
| 2013/0037871 | A1* | 2/2013 | Sudo | 257/295 |
| 2013/0056810 | A1* | 3/2013 | Sudo | 257/295 |
| 2013/0059401 | A1* | 3/2013 | Sudo | 438/3 |
| 2013/0065326 | A1* | 3/2013 | Sudo | 438/3 |
| 2013/0119482 | A1* | 5/2013 | Wann et al. | 257/401 |
| 2013/0230953 | A1* | 9/2013 | Sudo | 438/268 |
| 2013/0230965 | A1* | 9/2013 | Sudo | 438/404 |
| 2013/0285156 | A1* | 10/2013 | Cai et al. | 257/392 |
| 2014/0008706 | A1* | 1/2014 | Sudo | 257/288 |

OTHER PUBLICATIONS

Yang et al.; "35nm CMOS FinFETs", 2002 Symposium on VLSI Technology Digest of Technical Papers, 2 pages, (2002).

* cited by examiner

METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2011-197323, filed on Sep. 9, 2011; the entire contents of (all of) which are incorporated herein by reference.

FIELD

Embodiments described herein relate generally to a method for manufacturing semiconductor device.

BACKGROUND

Recently, in order to achieve compatibility between increased integration density and increased on-current in a MOSFET (metal-oxide-semiconductor field-effect transistor), a fin type MOSFET (hereinafter referred to as "FinFET") has been proposed. In a FinFET, a projected fin extending in one direction is formed on the upper surface of a semiconductor substrate. A gate electrode extending in another direction is provided so as to straddle this fin. Hence, the outer periphery of the portion of the fin surrounded with the gate electrode constitutes a channel region. Thus, the channel width can be expanded without increasing the device area.

However, with the downsizing of the FinFET, it is difficult to uniformly form a large number of FinFETs.

DETAILED DESCRIPTION

Figure 1A:
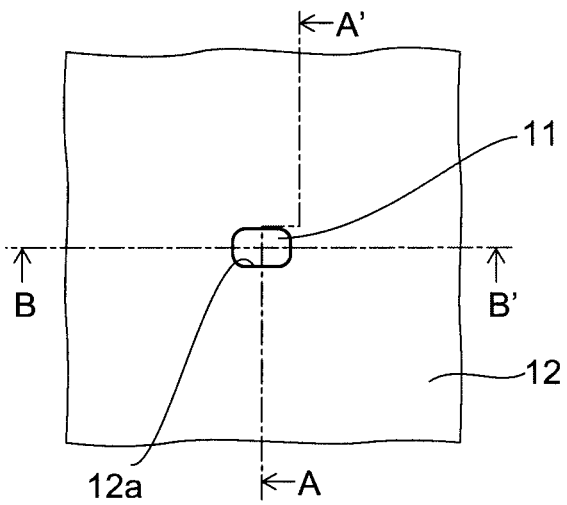
FIGS. 1A to 13C are process views illustrating a method for manufacturing a semiconductor device according to an embodiment.

In general, according to one embodiment, a method for manufacturing a semiconductor device, includes: forming a mask film on a partial region of a semiconductor substrate; forming a mask member above the semiconductor substrate in both the region where the mask film is formed and a region where the mask film is not formed; patterning the mask film and an upper portion of the semiconductor substrate by performing etching using the mask member as a mask; and removing part of the patterned upper portion of the semiconductor substrate by performing etching using the patterned mask film as a mask.

According to another embodiment, a method for manufacturing a semiconductor device, includes: forming a first silicon nitride film including an opening on a silicon substrate; forming a first silicon oxide film on a surface of the silicon substrate and the first silicon nitride film by performing radical oxidation treatment; forming a second silicon nitride film on the first silicon oxide film, film thickness of the second silicon nitride film being half or more of shortest diameter in the opening; forming a mask member made of a plurality of line-shaped members extending in one direction, arranged periodically, and partly passing immediately above the opening; processing an upper portion of the silicon substrate into a plurality of fins extending in the one direction and arranged periodically by patterning the mask member, the second silicon nitride film, the first silicon oxide film, the first silicon nitride film, and the upper portion of the silicon substrate by performing etching using the mask member as a mask; depositing an insulating material; heating the insulating material; forming a device isolation insulating film in a lower portion of space between the fins by setting back an upper surface of a film made of the insulating material by performing etching; selectively implanting impurity into the silicon substrate using the second silicon nitride film as a mask; forming a second silicon oxide film on a side surface of a portion of the fin projected from the device isolation insulating film; forming a sidewall made of non-doped silicon on a side surface of a stacked body in which the fin, the patterned first silicon nitride film, the patterned first silicon oxide film, and the patterned second silicon nitride film are stacked, and in which the second silicon oxide film is formed on the side surface of the fin; removing the second silicon nitride film using the first silicon oxide film as a stopper; removing the sidewall by performing wet etching with an alkaline solution using the second silicon oxide film as a stopper; removing a portion of the fin by performing etching using the patterned first silicon nitride film as a mask; embedding an insulating member in a depression, the depression being formed in an upper surface of the device isolation insulating film by removing the portion of the fin; forming a gate insulating film on the side surface of the portion of the fin projected from the device isolation insulating film; forming a gate electrode extending in a direction crossing the one direction so as to straddle the fin on the device isolation insulating film; and forming a magnetoresistive effect element.

Embodiments of the invention will now be described with reference to the drawings.

FIGS. 1A to 13C are process views illustrating a method for manufacturing a semiconductor device according to an embodiment. Each figure with suffix A is a plan view. Each figure with suffix B is a sectional view taken along line A-A' shown in the corresponding figure with suffix A. Each figure with suffix C is a sectional view taken along line B-B' shown in the corresponding figure with suffix A.

The semiconductor device according to this embodiment is e.g. a memory device, and more particularly an MRAM (magnetoresistive random access memory). In an MRAM, a plurality of memory cells are arrayed. Each memory cell includes a magnetoresistive memory element and a transistor. In this embodiment, the transistor constituting each memory cell is a FinFET.

Figure 1B:
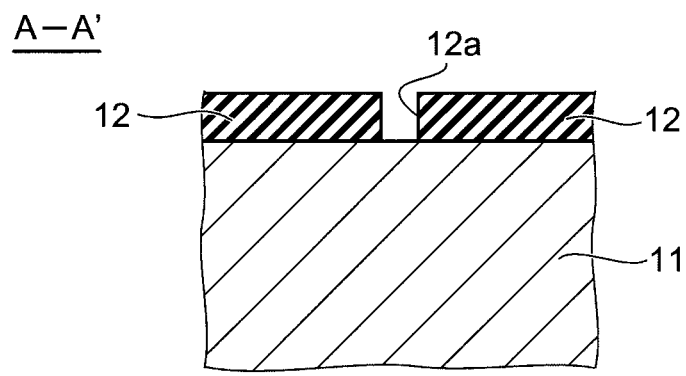
Figure 1C:
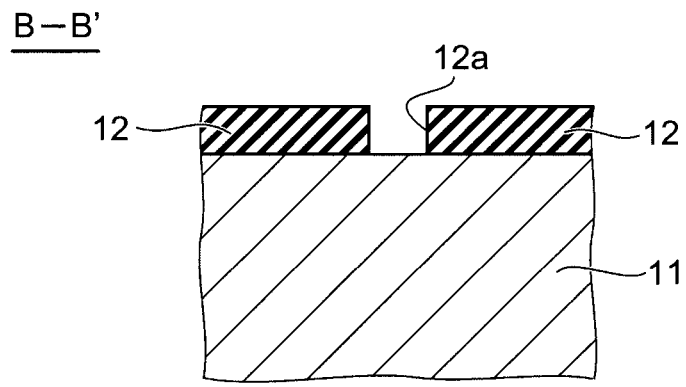

First, as shown in FIGS. 1A to 1C, a silicon substrate 11 is prepared. At least an upper portion of the silicon substrate 11 is a semiconductor doped with impurity. On the silicon substrate 11, a silicon nitride film 12 is formed as a mask film. Next, by e.g. the photolithography method and RIE (reactive ion etching) method, the silicon nitride film 12 is patterned. Thus, a desired portion of the silicon nitride film 12 is removed to form an opening 12a. The opening 12a is formed in a region where the fin of the FinFET is to be divided. The opening 12a has e.g. a generally rectangular shape. In FIGS.

1A to 1C, for convenience of illustration, the opening 12a is shown only at one position. However, the opening 12a may be formed at a plurality of positions.

Figure 2A:
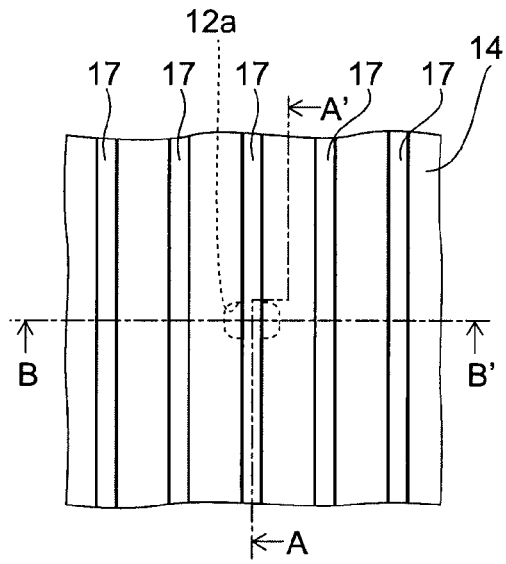
Figure 2B:
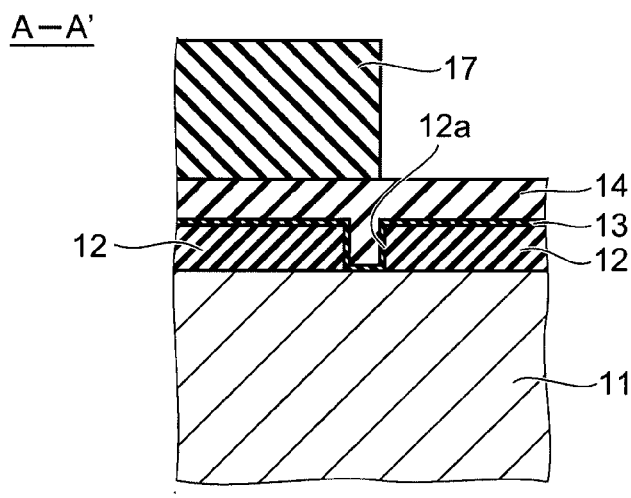
Figure 2C:
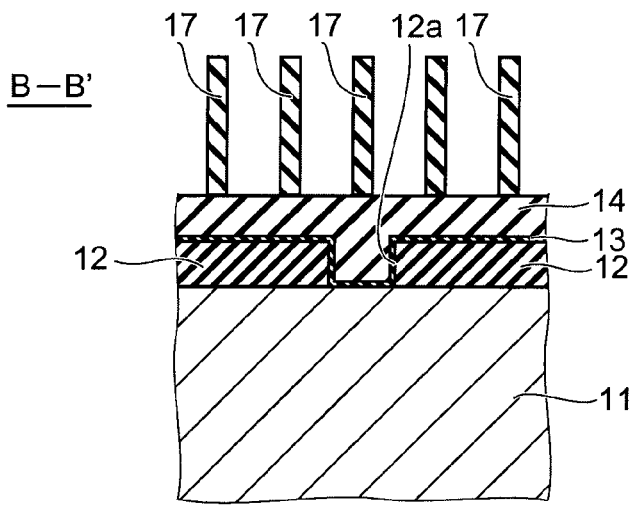

Next, as shown in FIGS. 2A to 2C, radical oxidation treatment is performed. Thus, the region of the upper surface of the silicon substrate 11 exposed in the opening 12a, and the surface of the silicon nitride film 12 are oxidized to form a silicon oxide film 13 as a stopper film. That is, the silicon oxide film 13 is formed on the silicon substrate 11 in both the region where the silicon nitride film 12 is formed and the region where the silicon nitride film 12 is not formed.

Next, on the silicon oxide film 13, a silicon nitride film 14 is formed as another mask film. The silicon nitride film 14 is formed entirely on the silicon oxide film 13. The silicon nitride film 14 is separated from the silicon nitride film 12 by the silicon oxide film 13. The silicon nitride film 14 is embedded in the opening 12a of the silicon nitride film 12. The film thickness of the silicon nitride film 14 is preferably set to half or more of the shortest diameter in the opening 12a, i.e., of the length of the short side of the rectangle. Thus, the silicon nitride film 14 is completely embedded in the opening 12a, and the upper surface of the silicon nitride film 14 is made flat.

Next, on the silicon nitride film 14, a hard mask member 17 made of e.g. silicon oxide is formed as a mask member. The hard mask member 17 is formed by e.g. the sidewall method as a plurality of line-shaped members extending in one direction and arranged periodically. Part of the line-shaped member is caused to pass immediately above the opening 12a. That is, the hard mask member 17 is formed on both the region where the silicon nitride film 12 is formed and the region where the silicon nitride film 12 is not formed.

Figure 3A:
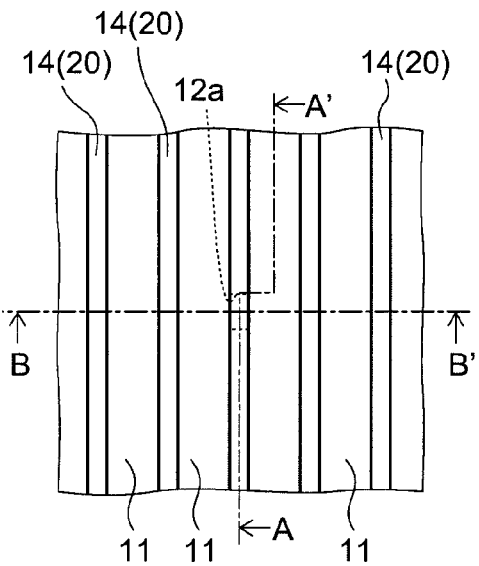
Figure 3B:
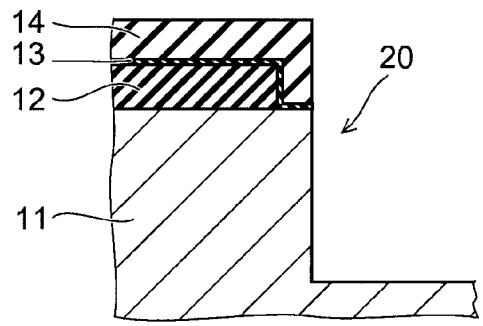
Figure 3C:
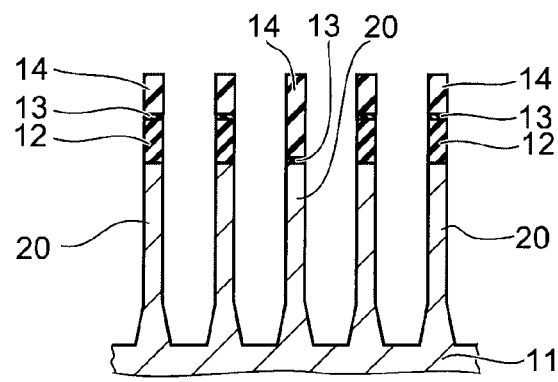

Next, as shown in FIGS. 3A to 3C, the hard mask member 17 (see FIGS. 2A to 2C) is used as a mask to perform etching. Thus, the silicon nitride film 14, the silicon oxide film 13, the silicon nitride film 12, and an upper portion of the silicon substrate 11 are selectively removed and patterned. Hence, the pattern of the hard mask member 17 is transferred to these members. Thus, the silicon nitride film 14, the silicon oxide film 13, and the silicon nitride film 12 are divided. Furthermore, in the upper portion of the silicon substrate 11, a plurality of fins 20 extending in one direction and arranged periodically are formed. Each fin 20 has a generally plate-like shape having a major surface perpendicular to the upper surface of the silicon substrate 11. However, the side surface of the root portion of the fin 20 is sloped with respect to the vertical direction. The width of the root portion is expanded downward in a tapered shape.

In this patterning step, the fins 20 are gaplessly formed at equal intervals. On the region immediately above the fin 20 where the silicon nitride film 12 is not formed, i.e., on the region corresponding to the opening 12a, the silicon nitride film 14 is placed thickly. Hence, throughout the region immediately above the fin 20, the total film thickness of the silicon nitride film 12, the silicon oxide film 13, and the silicon nitride film 14 is nearly uniform. That is, the distance from the bottom surface of the trench portion between the fins 20 of the silicon substrate 11 to the upper surface of the silicon nitride film 14 is nearly uniform. Thus, the microloading effect is suppressed, and the fins 20 can be processed into a uniform shape. Next, the hard mask member 17 is removed. Alternatively, at this stage, the hard mask member 17 may not be removed.

Figure 4A:
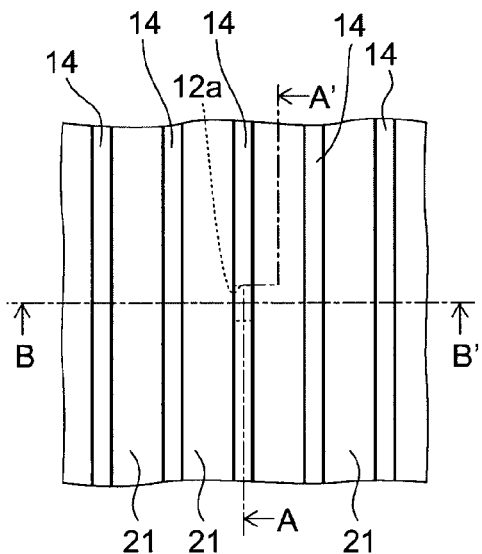
Figure 4B:
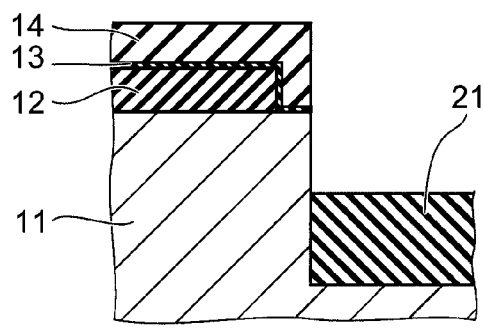
Figure 4C:
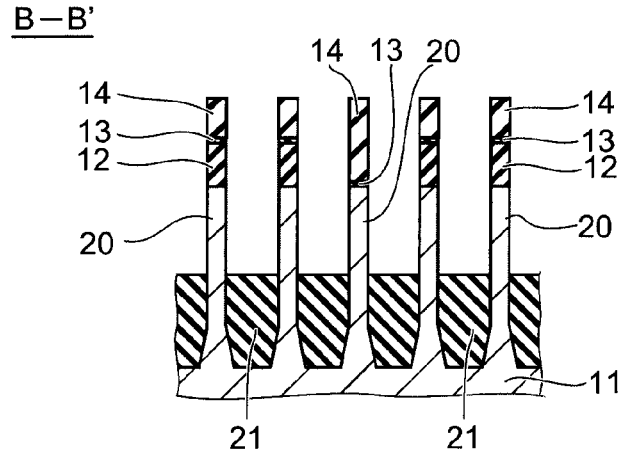

Next, as shown in FIGS. 4A to 4C, by e.g. the coating method, silicon oxide is deposited and then heated to form a device isolation insulating film 21 so as to cover the fin 20. At this time, the device isolation insulating film 21 is densified by heating. Furthermore, the device isolation insulating film 21 is densified also by heat treatment in the subsequent process. The device isolation insulating film 21 is partitioned into a plurality of regions by the fins 20. The degree of densification depends on the size of each region. Because the fins 20 are periodically arranged, the size of the partitioned regions of the device isolation insulating film 21 is also equal to each other. Thus, the degree of densification is uniform among the regions, and the composition of the device isolation insulating film 21 is also made uniform. Next, the silicon nitride film 14 is used as a stopper to perform CMP. Here, if the hard mask member 17 (see FIGS. 2A to 2C) was not removed in the step shown in FIGS. 3A to 3C, then in this step, the hard mask member 17 is also removed together with the device isolation insulating film 21.

Next, by wet etching with an etching liquid containing hydrogen fluoride (HF), the upper surface of the device isolation insulating film 21 is set back. Thus, the device isolation insulating film 21 is formed in a lower portion of the space between the fins 20. At this time, if the composition of the device isolation insulating film 21 is uniform, the degree of etching is also made uniform. Thus, the upper surface is made flat. Here, the upper portion of the device isolation insulating film 21 may be removed by combining RIE with wet etching based on hydrogen fluoride (HF). Furthermore, the device isolation insulating film 21 may be deposited by the CVD (chemical vapor deposition) method.

Next, the silicon nitride film 14 is used as a mask to selectively implant impurity into the silicon substrate 11. Thus, in the middle portion of the fin 20, i.e., in the portion of the fin 20 near the upper surface of the device isolation insulating film 21, an impurity diffusion region (not shown) for suppressing punch-through is formed.

Figure 5A:
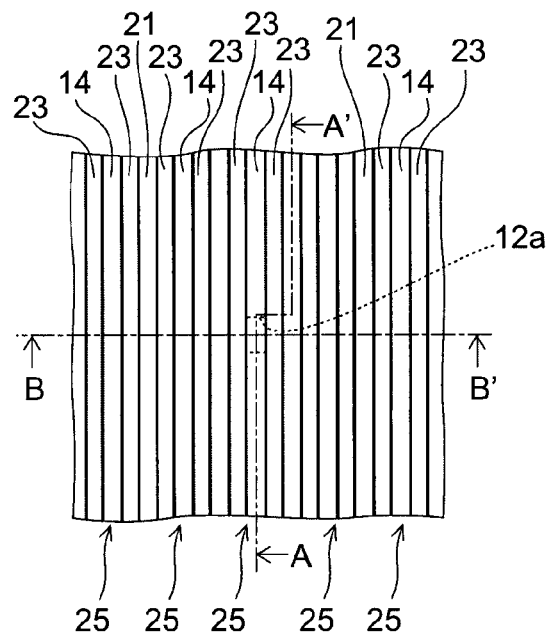
Figure 5B:
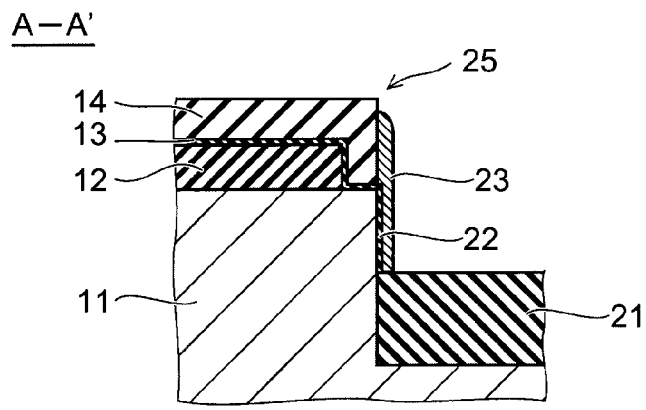
Figure 5C:
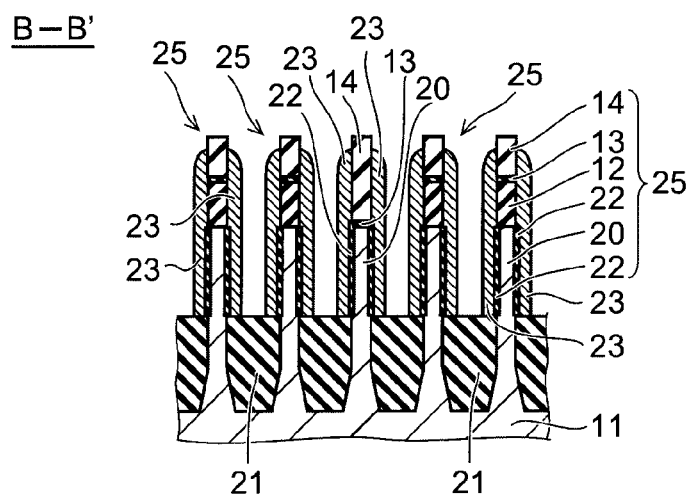

Next, as shown in FIGS. 5A to 5C, oxidation treatment is performed. Thus, on the side surface of the portion of the fin 20 projected from the upper surface of the device isolation insulating film 21, a silicon oxide film 22 is formed as a protective film. Next, by e.g. the LPCVD (low pressure chemical vapor deposition) method or PECVD (plasma enhanced CVD) method, an amorphous silicon film not doped with impurity is formed on the entire surface. By etching back this amorphous silicon film, a sidewall 23 made of non-doped amorphous silicon is formed on the side surface of the stacked body 25 made of the fin 20, the silicon nitride film 12, the silicon oxide film 13, the silicon nitride film 14, and the silicon oxide film 22. The impurity concentration of the sidewall 23 is lower than the impurity concentration of the silicon substrate 11.

Figure 6A:
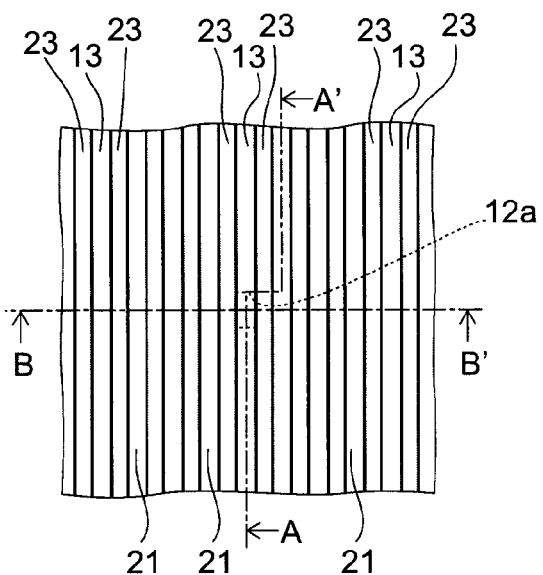
Figure 6B:
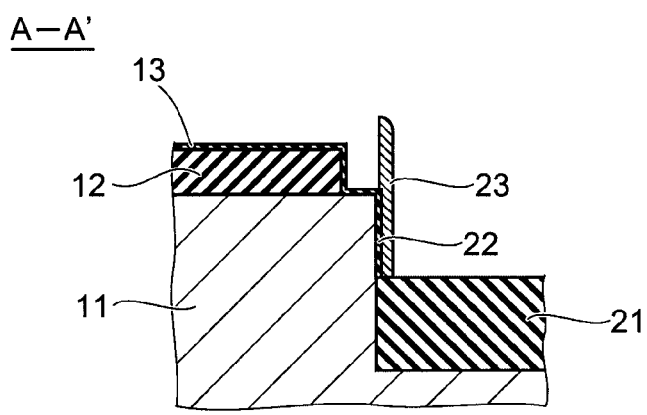
Figure 6C:
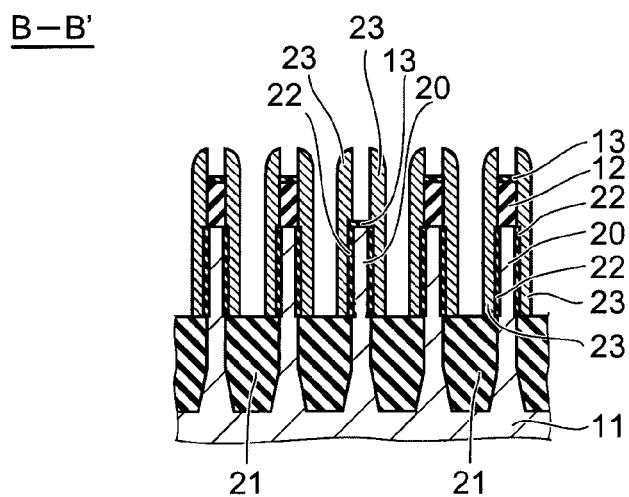

Next, as shown in FIGS. 6A to 6C, the silicon oxide film 13 is used as a stopper to perform wet etching with e.g. phosphoric acid to remove the silicon nitride film 14 (see FIGS. 5A to 5C). At this time, the silicon nitride film 12 is not removed because the silicon nitride film 12 is covered with the silicon oxide film 13 and the sidewall 23.

Figure 7A:
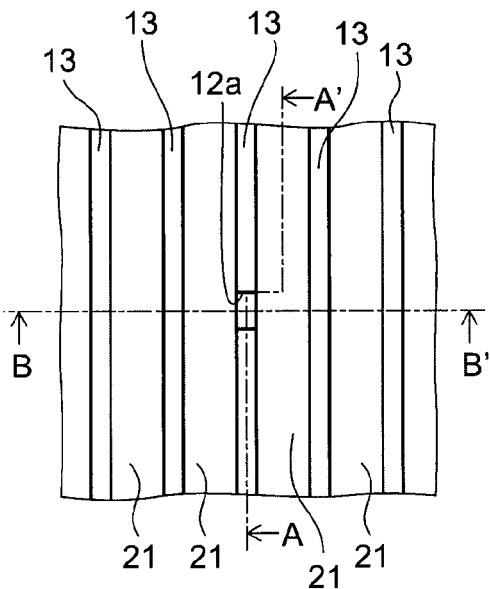
Figure 7B:
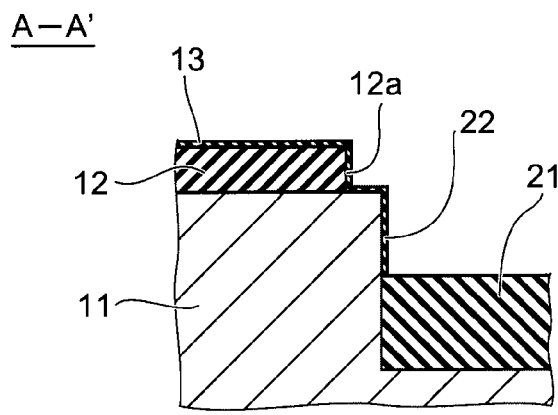
Figure 7C:
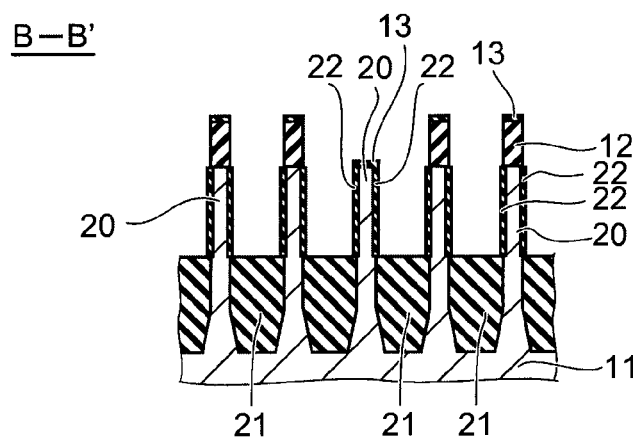

Next, as shown in FIGS. 7A to 7C, the silicon oxide film 13 and the silicon oxide film 22 are used as a stopper to perform wet etching with an alkaline solution to remove the sidewall 23 (see FIGS. 6A to 6C). At this time, the part of the upper portion of the fin 20 immediately below the opening 12a is covered with the silicon oxide film 13 and the silicon oxide film 22. The remaining part of the upper portion of the fin 20 is covered with the silicon nitride film 12 and the silicon oxide film 22. The lower portion of the fin 20 and the portion of the silicon substrate 11 other than the fin 20 are covered with the device isolation insulating film 21. Thus, these portions are not removed.

Figure 8A:
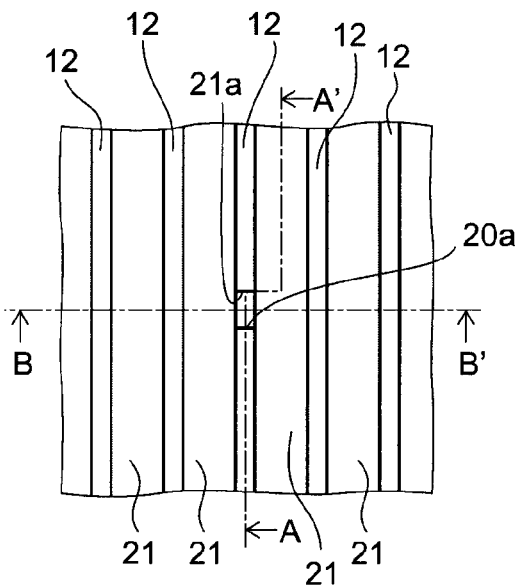
Figure 8B:
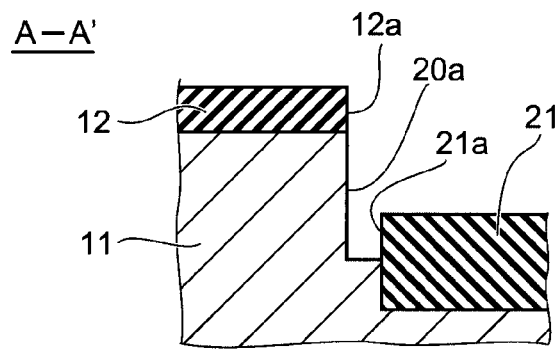
Figure 8C:
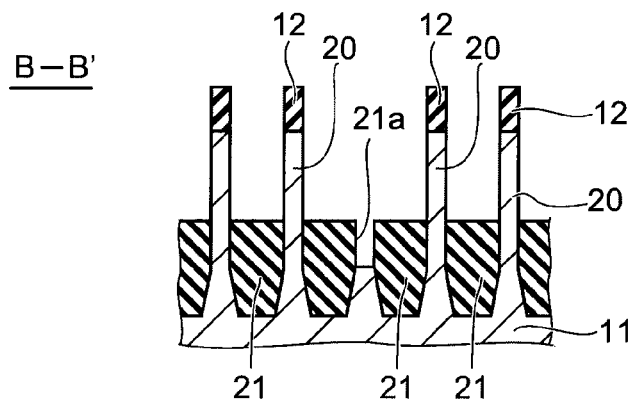

Next, as shown in FIGS. 8A to 8C, by wet processing, the silicon oxide films 13 and 22 are removed.

Next, the patterned silicon nitride film 12 is used as a mask to perform etching such as RIE. Thus, a portion of the fin 20, i.e., the portion not covered with the silicon nitride film 12, is removed and recessed to below the upper surface of the device isolation insulating film 21. As a result, a gap 20a is formed in the fin 20. Furthermore, a depression 21a is formed in the upper surface of the device isolation insulating film 21. The gap 20a and the depression 21a are formed in part of the silicon nitride film 12 immediately below the opening 12a. Here, the silicon oxide films 13 and 22 may be removed not by wet processing, but by this RIE processing together with the portion of the fin 20.

Figure 9A:
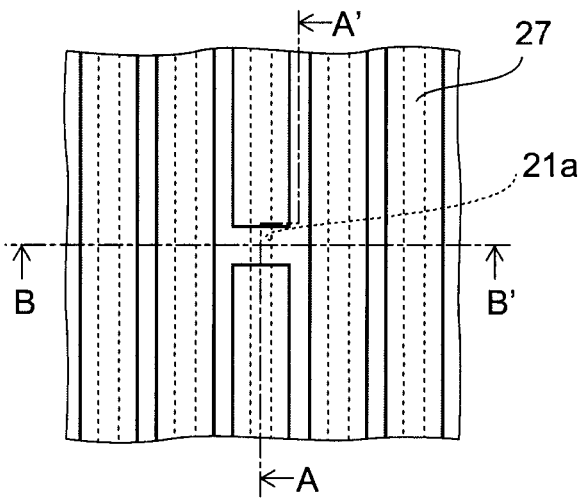
Figure 9B:
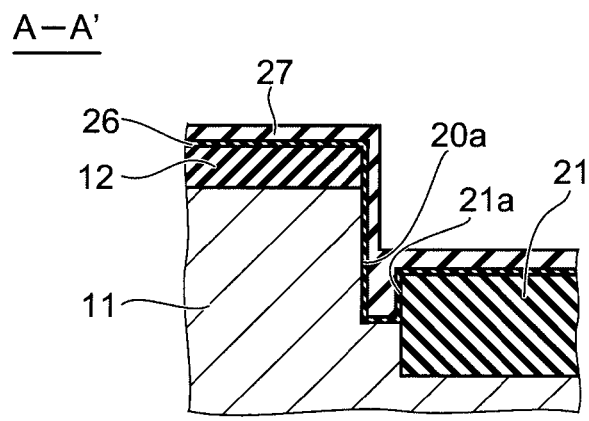
Figure 9C:
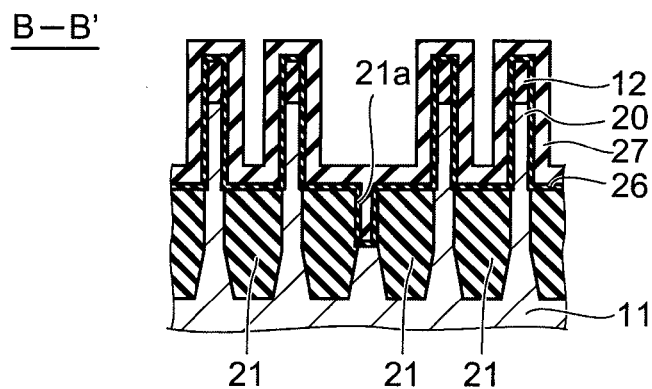

Next, as shown in FIGS. 9A to 9C, a silicon oxide film 26 is formed on the entire surface. Subsequently, a silicon nitride film 27 is formed. At this time, the silicon oxide film 26 and the silicon nitride film 27 are formed on the device isolation insulating film 21 so as to cover the fin 20, and also embedded inside the depression 21a.

Figure 10A:
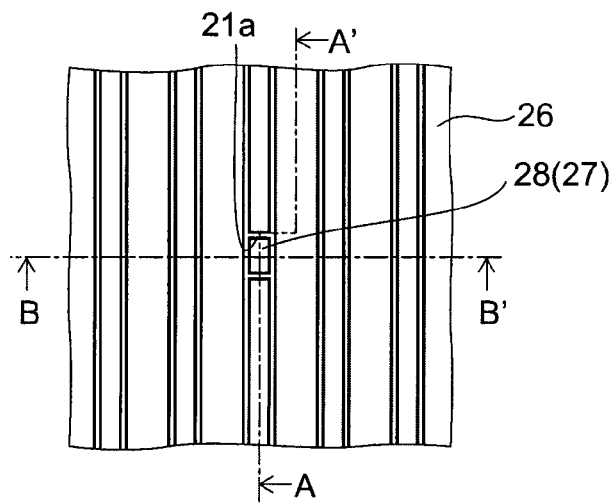
Figure 10B:
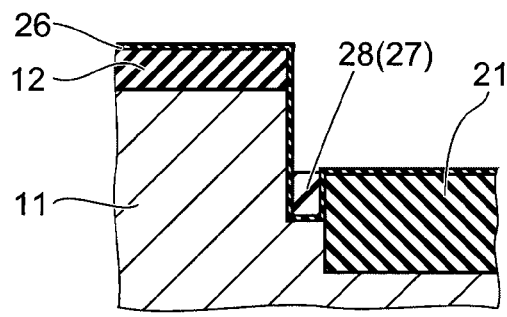
Figure 10C:
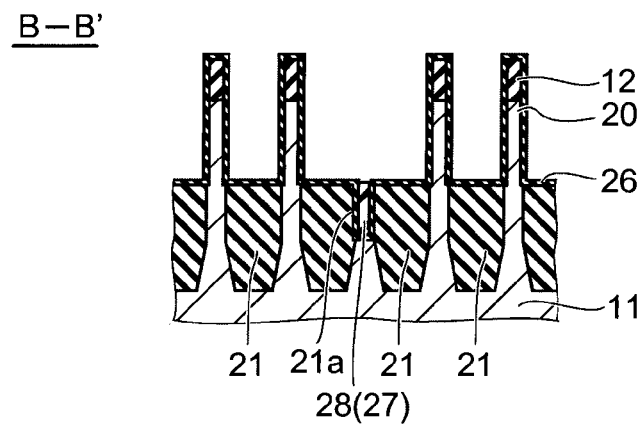

Next, as shown in FIGS. 10A to 10C, wet etching with phosphoric acid is performed on the silicon nitride film 27. Thus, the silicon nitride film 27 is removed from outside the depression 21a while being left in the depression 21a. As a result, an insulating member 28 made of the remaining portion of the silicon nitride film 27 is embedded in the depression 21a. Next, by wet etching with hydrogen fluoride (HF), the silicon oxide film 26 is removed. At this time, the silicon oxide film 26 is left on the inner surface of the depression 21a.

Figure 11A:
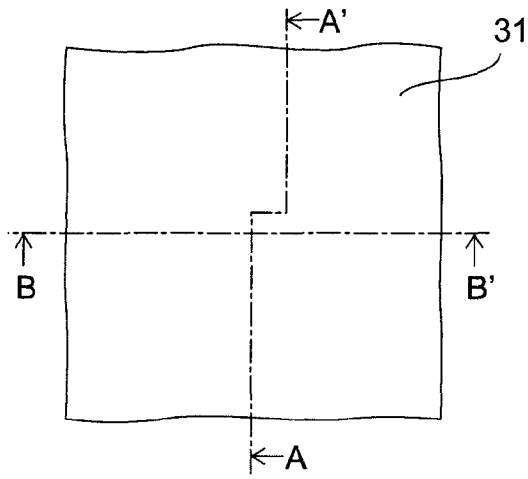
Figure 11B:
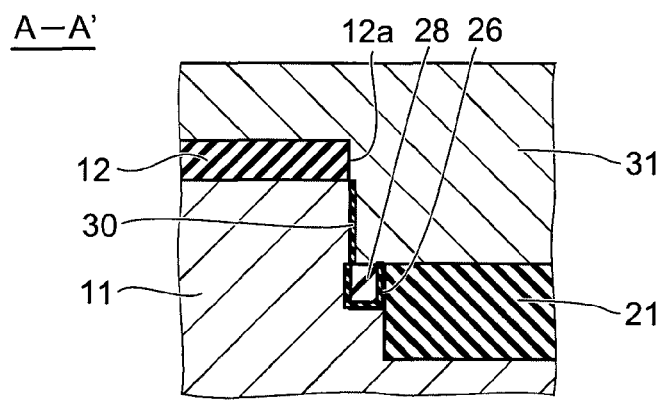
Figure 11C:
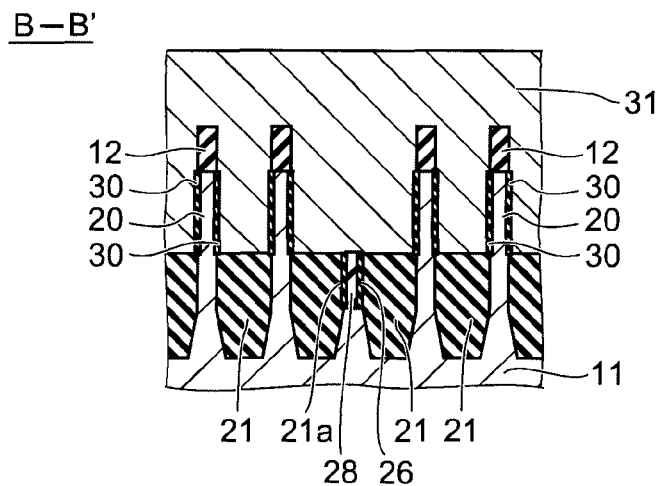

Next, as shown in FIGS. 11A to 11C, by oxidation treatment, a gate insulating film 30 is formed on the side surface of the portion of the fin 20 projected from the device isolation insulating film 21. Next, a conductive material such as polysilicon doped with impurity is deposited on the entire surface to form a polysilicon film 31 covering the fin 20. At this time, the insulating member 28 is embedded in the depression 21a of the device isolation insulating film 21. Hence, there is no case where the polysilicon film 31 penetrates into the depression 21a and is brought into contact with the silicon substrate 11. Next, CMP (chemical mechanical polishing) is performed on the polysilicon film 31.

Figure 12A:
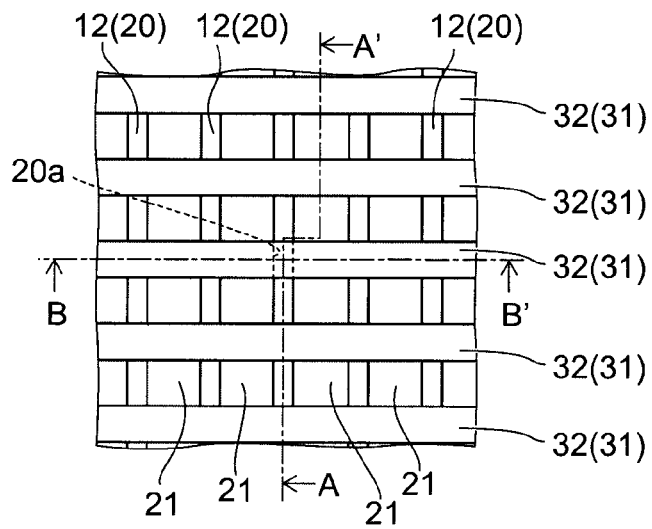
Figure 12B:
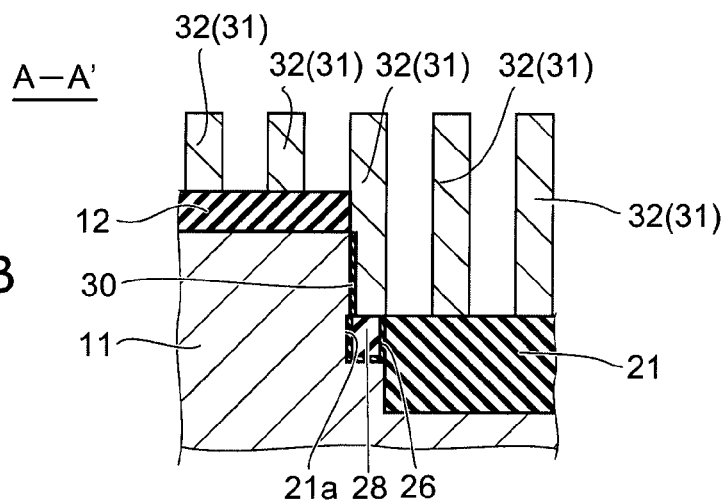
Figure 12C:
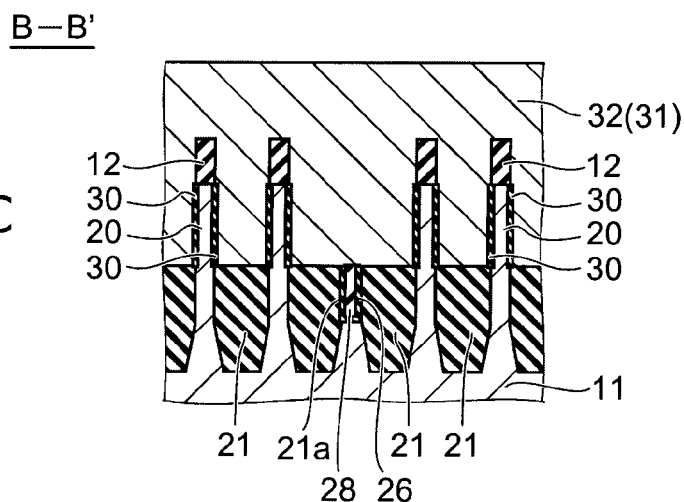

Next, as shown in FIGS. 12A to 12C, RIE is performed on the polysilicon film 31 under the condition that can ensure a sufficient selection ratio with respect to the silicon nitride film 12. Thus, the polysilicon film 31 is patterned. Accordingly, a plurality of gate electrodes 32 are formed on the device isolation insulating film 21 so as to straddle the fin 20. The gate electrodes 32 extend in a direction crossing, such as orthogonal to, the extending direction of the fin 20 and are arranged periodically. At this time, immediately above the fin 20, the silicon nitride film 12 is used as a stopper to stop the etching.

Next, the gate electrodes 32 are used as a mask to implant impurity into the fin 20. Thus, a diffusion layer (not shown) is formed in the fin 20. Accordingly, a FinFET is configured at each nearest point between the fin 20 and the gate electrode 32. As viewed from above, a plurality of fins 20 and gate electrode 32 are arranged like a lattice. Hence, a plurality of FinFETs are arrayed like a matrix. At a desired position in the fin 20, a gap 20a is formed.

Figure 13A:
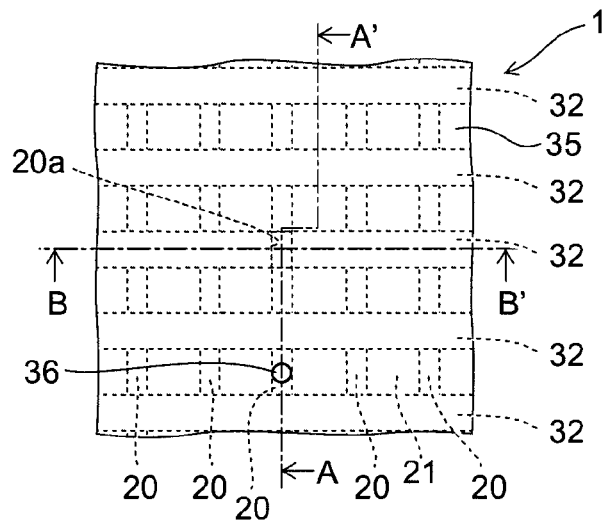
Figure 13B:
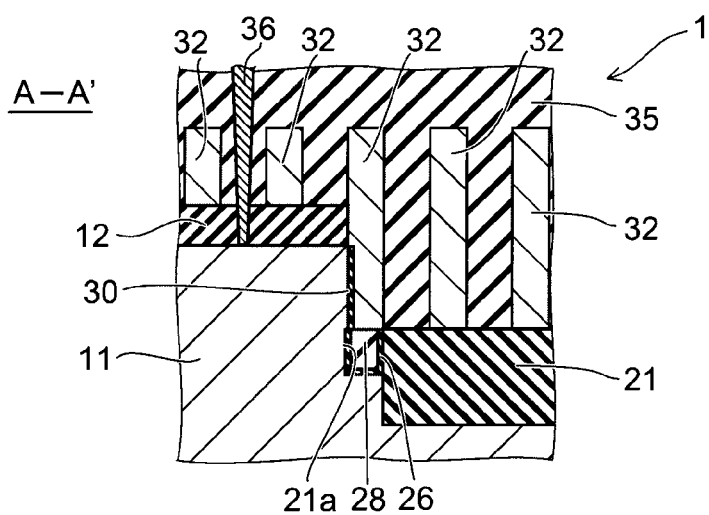
Figure 13C:
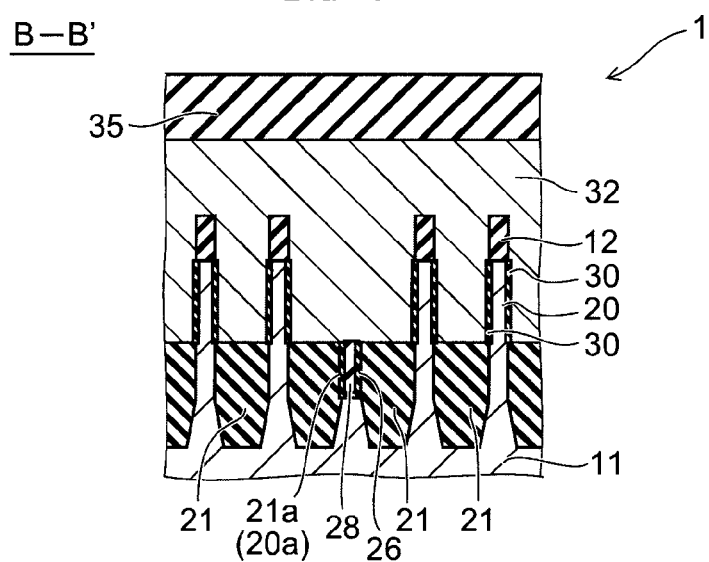

Next, as shown in FIGS. 13A to 13C, on the device isolation insulating film 21, an interlayer insulating film 35 is formed so as to cover the gate electrodes 32. Next, a plurality of contacts 36 are formed in the interlayer insulating film 35. The contact 36 is formed on each region immediately above the diffusion layer of the fin 20, i.e., on each portion of the fin 20 not covered with the gate electrode 32 as viewed from above. Here, for convenience of illustration, FIGS. 13A and 13B show only one contact 36. Subsequently, a magnetoresistive effect element (not shown) is formed on the interlayer insulating film 35 and connected to each FinFET through the contact 36. Thus, the semiconductor device 1 according to this embodiment is manufactured.

Next, the effect of this embodiment is described.

In this embodiment, in the step shown in FIGS. 1A to 1C, a silicon nitride film 12 including an opening 12a is formed on the silicon substrate 11. In the step shown in FIGS. 3A to 3C, the upper portion of the silicon substrate 11 is patterned together with this silicon nitride film 12 to form a fin 20. Thus, in the step of forming the fin 20, no gap 20a is formed in the fin 20. Hence, the distance between the fins 20 can be made uniform. Thus, the microloading effect is suppressed, and the silicon substrate 11 can be etched under a uniform condition throughout the processed region. As a result, the fins 20 can be processed into a uniform shape, and the characteristics of FinFETs can be made uniform. Then, in the step shown in FIGS. 8A to 8C, the patterned silicon nitride film 12 is used as a mask to perform etching. Thus, a gap 20a can be formed in the region of the fin 20 immediately below the opening 12a.

The effect of suppressing the microloading effect is described below more specifically. The effect of etching in forming the fin 20 depends on the distance to the adjacent fin 20. Thus, if a gap is formed in the fin 20 at the time of etching for forming the fin 20, the presence of the gap causes a large difference in the distance to the adjacent fin 20. Thus, the shape of the processed fin 20 is significantly varied by the microloading effect. For instance, consider the case where the etching condition is optimized for the arrangement of the fins 20 at a short pitch. Then, if the distance to the adjacent fin 20 is large, the slope of the side surface of the fin 20 is increased, and the fin 20 is thickened. This varies the characteristics of the FinFET whose body region is made of the fin 20.

In contrast, according to this embodiment, in the etching step for forming the fin 20, no gap 20a is formed. Hence, the distance between the fins 20 can be made nearly equal, and the effect of etching can be made uniform. As a result, the shape of the fins 20 can be made uniform. On the other hand, an opening 12a is formed in the silicon nitride film 12, and after the fin 20 is formed, the silicon nitride film 12 is used as a mask to perform etching. Accordingly, a gap 20a can be formed in the fin 20. Thus, according to this embodiment, in a device requiring a gap 20a in the fin 20, the shape accuracy of the fin 20 can be enhanced, and the characteristics of the FinFETs can be made uniform. This effect is particularly significant in the case where the fin 20 has a high aspect ratio.

Furthermore, in the step shown in FIGS. 3A to 3C, the fins 20 are formed at equal intervals. Thus, in the step shown in FIGS. 4A to 4C, the device isolation insulating film 21 can be uniformly formed. For instance, the shrinkage ratio of the device isolation insulating film 21 under heating and densification is made uniform. Thus, the composition of the device isolation insulating film 21 is made uniform. As a result, in etching the device isolation insulating film 21, a uniform etching rate can be obtained. Thus, the upper surface of the device isolation insulating film 21 can be made flat. Hence, when gate electrodes 32 are formed in the step shown in FIGS. 12A to 12C, the height of the portion of the fin 20 covered with the gate electrode 32 is made uniform. Thus, the channel width of the FinFET is made uniform. Also for this reason, the characteristics of the FinFETs can be made uniform.

Furthermore, in this embodiment, in the step shown in FIGS. 4A to 4C, the patterned silicon nitride film 14 is used as a mask to implant impurity into the fin 20. Then, in the step shown in FIGS. 5A to 5C, a sidewall 23 made of non-doped amorphous silicon is formed on the side surface of the stacked body 25 in which the fin 20, the silicon nitride film 12, the silicon oxide film 13, and the silicon nitride film 14 are stacked, before the silicon nitride film 14 is removed in the step shown in FIGS. 6A to 6C. Thus, only the silicon nitride film 14 can be removed while protecting the silicon nitride film 12 by the silicon oxide film 13 and the sidewall 23. Subsequently, the sidewall 23 is removed. Thus, only the silicon nitride film 14 can be removed without collapsing the fin 20. Accordingly, the yield of the semiconductor device 1 is improved.

This process and effect can be described in broader terms as follows.

FIGS. 14A to 14F are process sectional views illustrating the sidewall covering process in this embodiment.

Figure 14A:
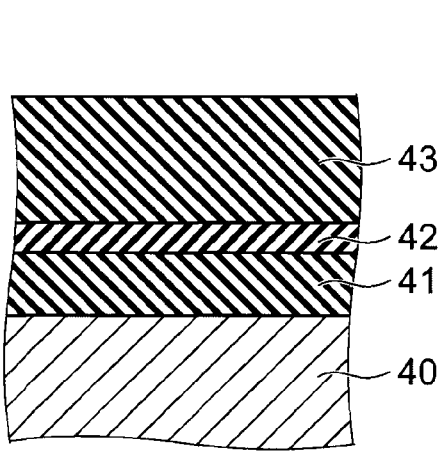
FIGS. 14A to 14F are process sectional views illustrating the sidewall covering process in this embodiment.

As shown in FIG. 14A, a first film 41 made of a first material, a second film 42 made of a second material different from the first material, and a third film 43 made of a third material different from the second material are stacked in this order on a semiconductor substrate 40. Here, the first material and the third material may be the same material, or may be different materials. If the first material and the third material are the same material, then the material can be suitably allotted under the constrained condition of the semiconductor process. In this embodiment, the semiconductor substrate 40 is a silicon substrate 11. The first film 41 is a silicon nitride film 12, and the first material is silicon nitride. The second film 42 is a silicon oxide film 13, and the second material is silicon oxide. The third film 43 is a silicon nitride film 14, and the third material is silicon nitride.

Figure 14B:
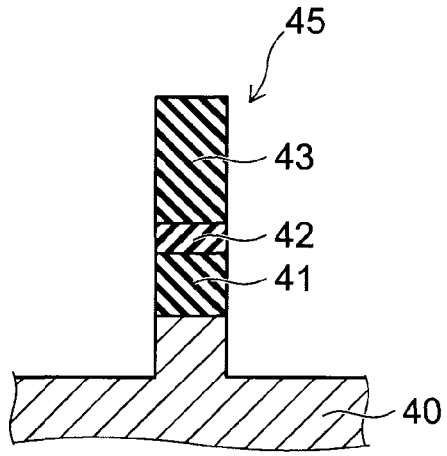

Next, as shown in FIG. 14B, the third film 43, the second film 42, the first film 41, and the semiconductor substrate 40 are patterned to form a stacked body 45. The stacked body 45 includes an upper portion of the semiconductor substrate 40, the first film 41, the second film 42, and the third film 43. Next, as necessary, the third film 43 is used as a mask to perform desired processing. For instance, the third film 43 is used as a mask to implant impurity into the semiconductor substrate 40.

Figure 14C:
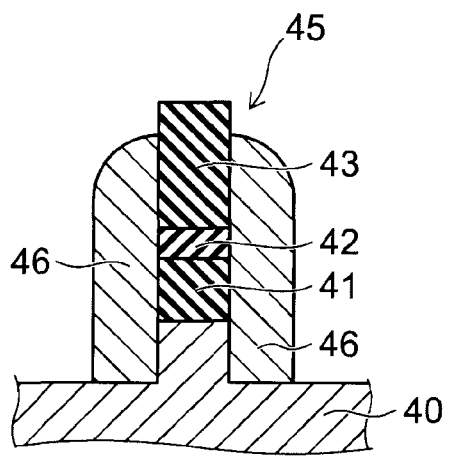

Next, as shown in FIG. 14C, a sidewall 46 made of a material different from any of the first material, the second material, and the third material is formed on the side surface of the stacked body 45. In this embodiment, the sidewall 46 (sidewall 23) is formed from non-doped amorphous silicon.

Figure 14D:
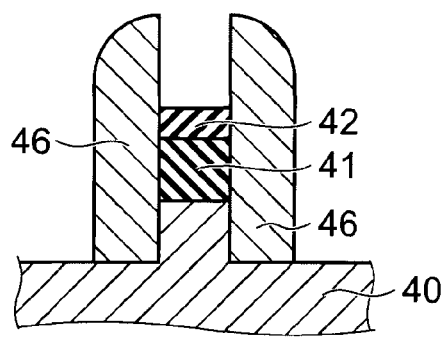

Next, as shown in FIG. 14D, the third film 43 is removed. At this time, the stacked body 45 is supported by the sidewall 46. Furthermore, the first film 41 is protected by the second film 42 and the sidewall 46. Thus, only the third film 43 can be removed.

Figure 14E:
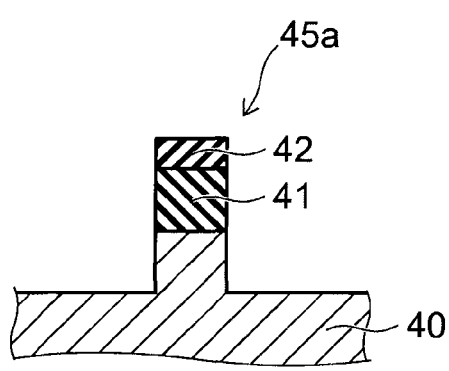

Next, as shown in FIG. 14E, the sidewall 46 is removed. Thus, a stacked body 45a with the first film 41 and the second film 42 stacked therein is left on the semiconductor substrate 40.

Figure 14F:
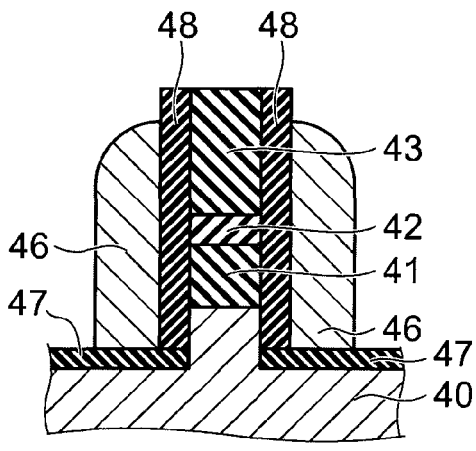

As in this embodiment, if the semiconductor substrate 40 and the sidewall 46 include the same component (e.g., silicon), then as shown in FIG. 14F, before forming the sidewall 46, a fourth film 47 made of a material different from the third material and the material of the sidewall may be formed on the region of the upper surface of the semiconductor substrate 40 where the stacked body 45 is not formed. Furthermore, a fifth film 48 made of a material different from the third material and the material of the sidewall may be formed on the side surface of the portion of the semiconductor substrate 40 constituting the stacked body 45. At this time, the fourth film 47 and the fifth film 48 may be formed from the same material. Thus, even if etching is performed under the condition such that both the semiconductor substrate 40 and the sidewall 46 are etched, only the sidewall 46 can be removed while protecting the semiconductor substrate 40 by the fourth film 47, the fifth film 48, and the second film 42.

Furthermore, in this embodiment, in the step shown in FIGS. 1A to 1C, a silicon nitride film 12 is formed on the silicon substrate 11. In the step shown in FIGS. 3A to 3C, when the fin 20 is formed, the silicon nitride film 12 is also processed and left on the fin 20. In the step shown in FIGS. 12A to 12C, when the polysilicon film 31 is etched to form a gate electrode 32, the silicon nitride film 12 is used as a stopper immediately above the fin 20. Thus, when the gate electrode 32 is formed, overetching of the fin 20 can be prevented.

Next, a comparative example of this embodiment is described.

Figure 15A:
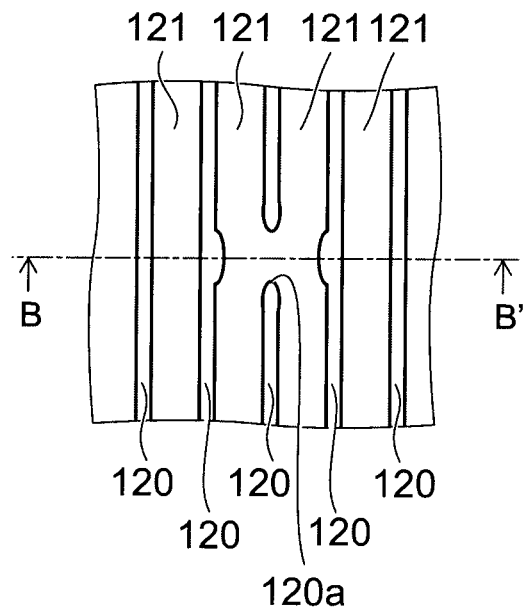
FIG. 15A is a process plan view illustrating a method for manufacturing a semiconductor device according to this comparative example.
Figure 15B:
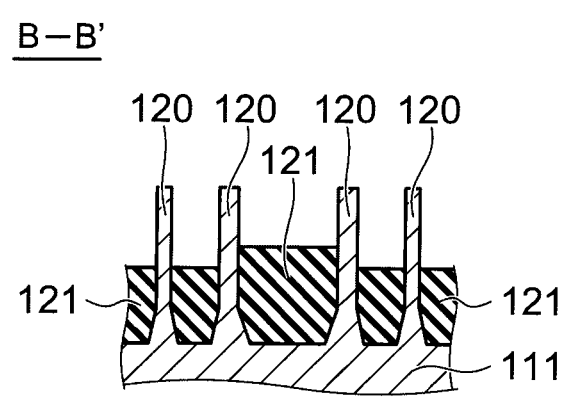
FIG. 15B is a sectional view taken along line B-B'.

FIG. 15A is a process plan view illustrating a method for manufacturing a semiconductor device according to this comparative example. FIG. 15B is a sectional view taken along line B-B'.

Figure 16A:
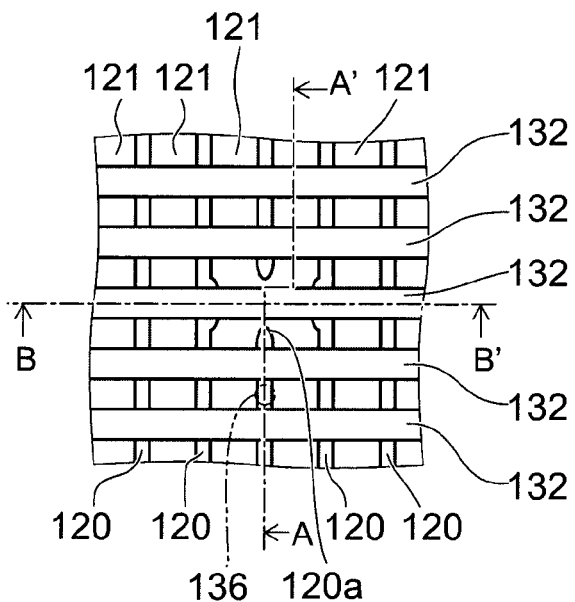
FIG. 16A is a process plan view illustrating the method for manufacturing a semiconductor device according to this comparative example.
Figure 16B:
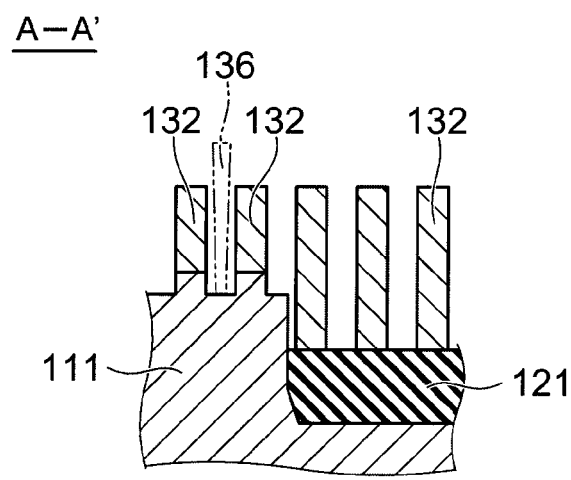
FIG. 16B is a sectional view taken along line A-A' shown in FIG. 16A.
Figure 16C:
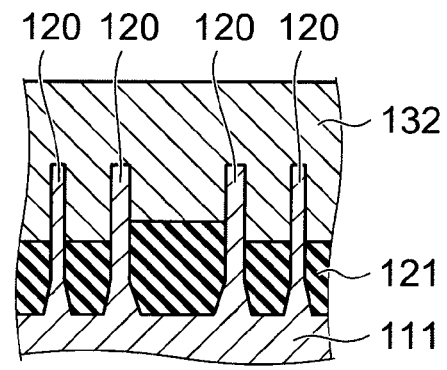
FIG. 16C is a sectional view taken along line B-B' shown in FIG. 16A.

FIG. 16A is a process plan view illustrating the method for manufacturing a semiconductor device according to this comparative example. FIG. 16B is a sectional view taken along line A-A' shown in FIG. 16A. FIG. 16C is a sectional view taken along line B-B' shown in FIG. 16A.

In this comparative example, when the fin is formed by etching, a gap is simultaneously formed.

As shown in FIGS. 15A and 15B, in this comparative example, etching is performed on the upper surface of a silicon substrate 111 to form fins 120. At this time, by patterning, a gap 120a is formed in a prescribed fin 120. For instance, by the sidewall method, a line-and-space mask member is formed. Then, a resist film is formed. In the resist film, an opening is formed in the region where the gap 120a is to be formed. This resist film is used as a mask to perform etching to remove a portion of the line-and-space mask member. Then, this mask member is used to perform anisotropic etching. Thus, a fin 120 is formed immediately below the mask member, and a gap 120a is formed immediately below the portion where the mask member is removed.

However, in this case, in the region where the gap 120a is formed, the distance between two fins 120 opposed across the gap 120a is made longer. Thus, by the microloading effect, the shape of the portion of the fins 120 opposed to the gap 120a is varied. For instance, the portion of the fin 120 located near the gap 120a is made generally thicker than the other fins 120. The side surface on the gap 120a side is tapered not only in the root portion but also entirely, including the upper portion. The slope of the side surface in the root portion is made more gradual. Thus, the portion of the fin 120 located near the gap 120a is made thicker than the other portion, and the shape is made asymmetric.

Furthermore, the distance between the fins 120 opposed across the gap 120a is longer than the distance between the fins 120 in the other region. Hence, near the gap 120a, when the device isolation insulating film 121 is formed, the degree of densification is different. As a result, the composition of the densified device isolation insulating film 121 is made different, and the etching rate is made different. Specifically, near the gap 120a, the space between the fins is wider than in the other region. Hence, near the gap 120a, densification proceeds further, and the etching rate is made lower in the subsequent wet etching. As a result, the upper surface of the device isolation insulating film 121 is made higher than in the surroundings. By these factors, the characteristics of the Fin-FET formed near the gap 120a are made significantly different from the characteristics of the other FinFETs.

Furthermore, as shown in FIGS. 16A to 16C, in this comparative example, the silicon nitride film 12 (see FIGS. 13A to 13C) is not provided on the fin 120. Hence, when the polysilicon film is etched and processed into a gate electrode 132, local overetching occurs at the upper surface of the fin 120. Thus, the upper surface of the portion of the fin 120 not covered with the gate electrode 132, i.e., of the portion constituting a source/drain, is set back. To this portion constituting a source/drain, an inversely tapered contact 136 is connected. However, the position of the upper surface of this portion is lowered. This decreases the area of the lower end of the contact 136, and increases the resistance.

In contrast, as described above, in this embodiment, in the step of processing the fin 20 and the step of forming a device isolation insulating film 21, the gap 20a is not formed. Hence, the distance between the fins 20 is made uniform. Thus, the fin 20 and the device isolation insulating film 21 can be uniformly formed. Furthermore, in this embodiment, a silicon nitride film 12 is provided on the silicon substrate 11. When the fin 20 is formed, the silicon nitride film 12 is also processed and left on the fin 20. The silicon nitride film 12 is used as a stopper to process a gate electrode 32. As a result, when the gate electrode 32 can be patterned, overetching of the upper surface of the fin 20 is prevented. This can prevent the decrease of the area of the lower surface of the contact 36.

The embodiment described above can realize a method for manufacturing a semiconductor device having uniform device characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A method for manufacturing a semiconductor device, comprising:
   forming a mask film on a partial region of a semiconductor substrate;
   forming a mask member above the semiconductor substrate in both the region where the mask film is formed and a region where the mask film is not formed;
   patterning the mask film and an upper portion of the semiconductor substrate by performing etching using the mask member as a mask; and
   removing part of the patterned upper portion of the semiconductor substrate by performing etching using the patterned mask film as a mask.

2. The method according to claim 1, wherein
   an opening is formed in the mask film,
   the mask member is formed in a plurality of line-shaped members extending in one direction, arranged periodically, and partly passing immediately above the opening,
   in the patterning, the upper portion of the semiconductor substrate is processed into a plurality of fins extending in the one direction and arranged periodically, and
   in the removing, a portion of the fin is removed.

3. The method according to claim 2, further comprising:
   after the patterning and before the removing, forming a device isolation insulating film in a lower portion of space between the fins;
   forming a gate insulating film on a side surface of a portion of the fin projected from the device isolation insulating film; and
   after the forming a gate insulating film, forming a gate electrode extending in a direction crossing the one direction so as to straddle the fin on the device isolation insulating film.

4. The method according to claim 3, further comprising:
   after the removing and before the forming a gate insulating film, embedding an insulating member in a depression, the depression being formed in an upper surface of the device isolation insulating film by removing the portion of the fin.

5. The method according to claim 3, wherein the forming a device isolation insulating film includes:
   depositing an insulating material;
   heating the insulating material; and
   setting back an upper surface of a film made of the insulating material by performing etching.

6. The method according to claim 1, further comprising:
   after the forming a mask film and before the forming a mask member, forming a stopper film on both the region where the mask film is formed and the region where the mask film is not formed;
   forming another mask film on the stopper film;
   selectively implanting impurity into the semiconductor substrate using the other mask film as a mask; and
   before the removing part of the patterned upper portion of the semiconductor substrate, removing the other mask film using the stopper film as a stopper,
   wherein in the patterning, the other mask film and the stopper film are also patterned.

7. The method according to claim 6, wherein
   an opening is formed in the mask film, and
   film thickness of the other mask film is set to half or more of shortest diameter in the opening.

8. The method according to claim 6, further comprising:
   forming a sidewall on a side surface of a stacked body made of the patterned upper portion of the semiconductor substrate, the patterned mask film, the patterned stopper film, and the patterned other mask film; and
   after the removing the other mask film, removing the sidewall.

9. The method according to claim 8, further comprising:
   before the forming a sidewall, forming a protective film on the side surface of the patterned upper portion of the semiconductor substrate,
   wherein in the removing the sidewall, the sidewall is etched using the protective film as a stopper.

10. The method according to claim 9, wherein
    the semiconductor substrate and the sidewall are formed from silicon,
    the mask film and the other mask film are formed from silicon nitride, and
    the stopper film and the protective film are formed from silicon oxide.

11. The method according to claim 10, wherein the stopper film is formed by radical oxidation treatment.

12. The method according to claim 10, wherein
    the sidewall is formed from non-doped silicon, and
    in the removing the sidewall, wet etching with an alkaline solution is performed.

13. The method according to claim 1, further comprising:
    forming a magnetoresistive effect element.

14. A method for manufacturing a semiconductor device, comprising:

forming a first silicon nitride film including an opening on a silicon substrate;

forming a first silicon oxide film on a surface of the silicon substrate and the first silicon nitride film by performing radical oxidation treatment;

forming a second silicon nitride film on the first silicon oxide film, film thickness of the second silicon nitride film being half or more of shortest diameter in the opening;

forming a mask member made of a plurality of line-shaped members extending in one direction, arranged periodically, and partly passing immediately above the opening;

processing an upper portion of the silicon substrate into a plurality of fins extending in the one direction and arranged periodically by patterning the mask member, the second silicon nitride film, the first silicon oxide film, the first silicon nitride film, and the upper portion of the silicon substrate by performing etching using the mask member as a mask;

depositing an insulating material;

heating the insulating material;

forming a device isolation insulating film in a lower portion of space between the fins by setting back an upper surface of a film made of the insulating material by performing etching;

selectively implanting impurity into the silicon substrate using the second silicon nitride film as a mask;

forming a second silicon oxide film on a side surface of a portion of the fin projected from the device isolation insulating film;

forming a sidewall made of non-doped silicon on a side surface of a stacked body in which the fin, the patterned first silicon nitride film, the patterned first silicon oxide film, and the patterned second silicon nitride film are stacked, and in which the second silicon oxide film is formed on the side surface of the fin;

removing the second silicon nitride film using the first silicon oxide film as a stopper;

removing the sidewall by performing wet etching with an alkaline solution using the second silicon oxide film as a stopper;

removing a portion of the fin by performing etching using the patterned first silicon nitride film as a mask;

embedding an insulating member in a depression, the depression being formed in an upper surface of the device isolation insulating film by removing the portion of the fin;

forming a gate insulating film on the side surface of the portion of the fin projected from the device isolation insulating film;

forming a gate electrode extending in a direction crossing the one direction so as to straddle the fin on the device isolation insulating film; and forming a magnetoresistive effect element.

* * * * *